US010109419B2

(12) United States Patent
Morihara et al.

(10) Patent No.: US 10,109,419 B2
(45) Date of Patent: Oct. 23, 2018

(54) CAPACITOR COVER AND POWER CONVERSION DEVICE

(71) Applicant: KABUSHIKI KAISHA YASKAWA DENKI, Kitakyushu-shi (JP)

(72) Inventors: Takayuki Morihara, Kitakyushu (JP); Yuto Kubo, Kitakyushu (JP); Shigekatsu Nagatomo, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 97 days.

(21) Appl. No.: 15/281,074

(22) Filed: Sep. 30, 2016

(65) Prior Publication Data

US 2017/0018355 A1    Jan. 19, 2017

Related U.S. Application Data

(63) Continuation of application No. PCT/JP2014/059666, filed on Apr. 1, 2014.

(51) Int. Cl.
| | |
|---|---|
| *H01G 2/04* | (2006.01) |
| *H01G 2/02* | (2006.01) |
| *H01G 2/10* | (2006.01) |
| *H01G 4/224* | (2006.01) |
| *H02M 7/00* | (2006.01) |

(52) U.S. Cl.
CPC ............. *H01G 2/04* (2013.01); *H01G 2/02* (2013.01); *H01G 2/10* (2013.01); *H01G 4/224* (2013.01); *H02M 7/003* (2013.01)

(58) Field of Classification Search
CPC .. H01G 2/02; H01G 2/04; H01G 2/10; H01G 4/224; H02M 7/003; H02J 7/0045
See application file for complete search history.

(56) References Cited

U.S. PATENT DOCUMENTS

| | | | | |
|---|---|---|---|---|
| 7,956,573 | B1* | 6/2011 | Rosen | H02J 7/0045 320/107 |
| 8,134,343 | B2* | 3/2012 | Like | B60R 16/04 320/166 |
| 2008/0265586 | A1* | 10/2008 | Like | B60R 16/04 290/38 R |

(Continued)

FOREIGN PATENT DOCUMENTS

| | | |
|---|---|---|
| CN | 102751884 | 10/2012 |
| JP | 05-234802 | 9/1993 |
| JP | 2005-102464 | 4/2005 |

(Continued)

OTHER PUBLICATIONS

International Preliminary Report on Patentability with Translation of Written Opinion of the International Searching Authority for corresponding International Application No. PCT/JP2014/059666, dated Oct. 13, 2016.

(Continued)

*Primary Examiner* — James Wu
(74) *Attorney, Agent, or Firm* — Mori & Ward, LLP

(57) ABSTRACT

A capacitor cover configured to store a plurality of capacitors of a power conversion device is provided. The capacitor cover includes a first cover including a plurality of types of first contact surfaces configured to be in contact with one side of each surface of the capacitors of plurality of types with different sizes.

10 Claims, 8 Drawing Sheets

(56) References Cited

U.S. PATENT DOCUMENTS

2009/0257199 A1* 10/2009 Henderson .............. H01G 2/06
  361/728
2012/0262877 A1* 10/2012 Nagano .................... H01G 2/10
  361/690

FOREIGN PATENT DOCUMENTS

| | | |
|---|---|---|
| JP | 2007-020238 | 1/2007 |
| JP | 2008-053635 | 3/2008 |
| JP | 2010-035295 | 2/2010 |

OTHER PUBLICATIONS

International Search Report for corresponding International Application No. PCT/JP2014/059666, dated Jul. 8, 2014.
Written Opinion for corresponding International Application No. PCT/JP2014/059666, dated Jul. 8, 2014.
Japanese Office Action for corresponding JP Application No. 2016-511252, dated Aug. 31, 2016 (w/ English machine translation).
Chinese Office Action for corresponding CN Application No. 201480077408.7, dated Sep. 25, 2017.

* cited by examiner

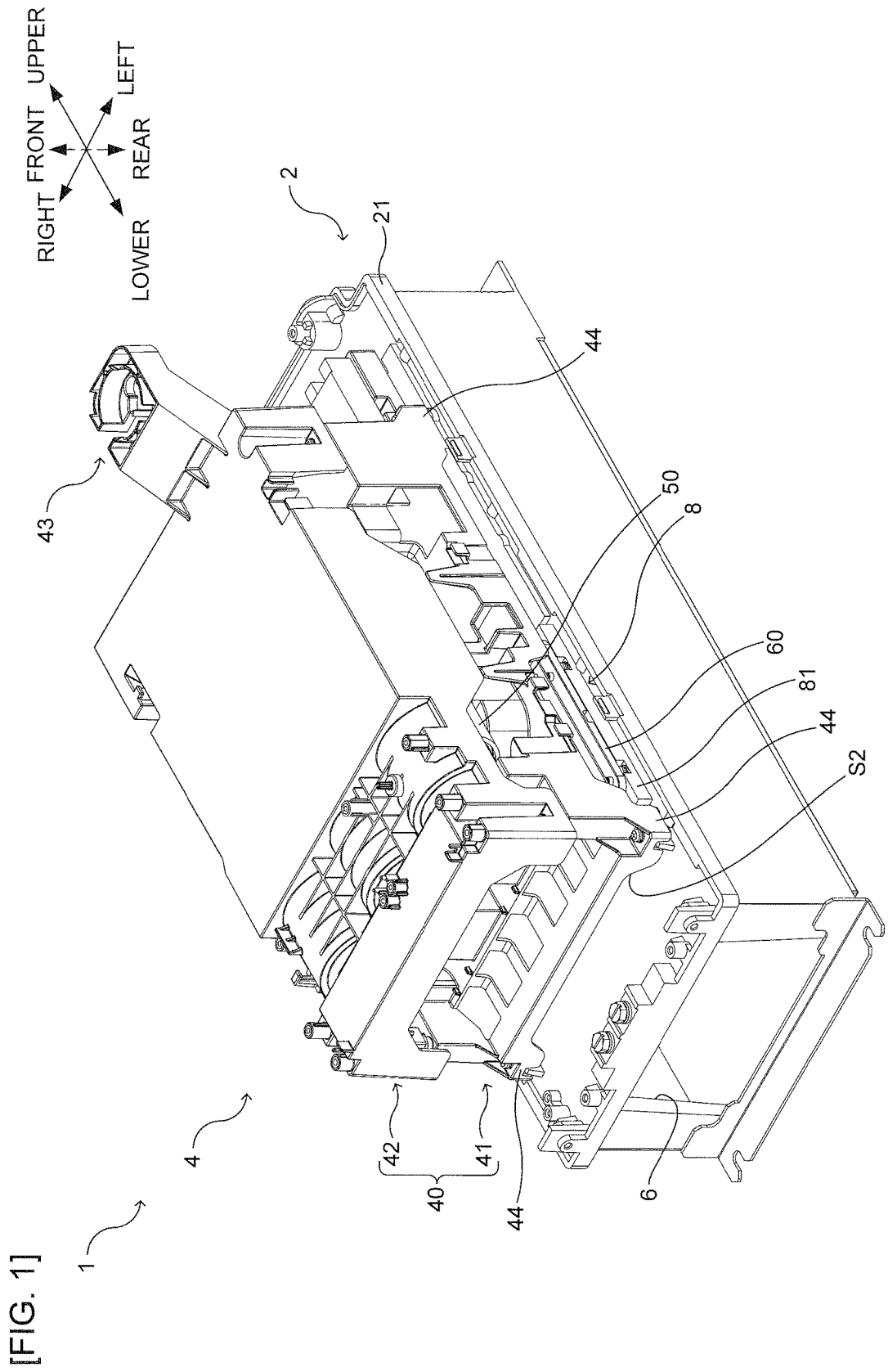
[FIG. 1]

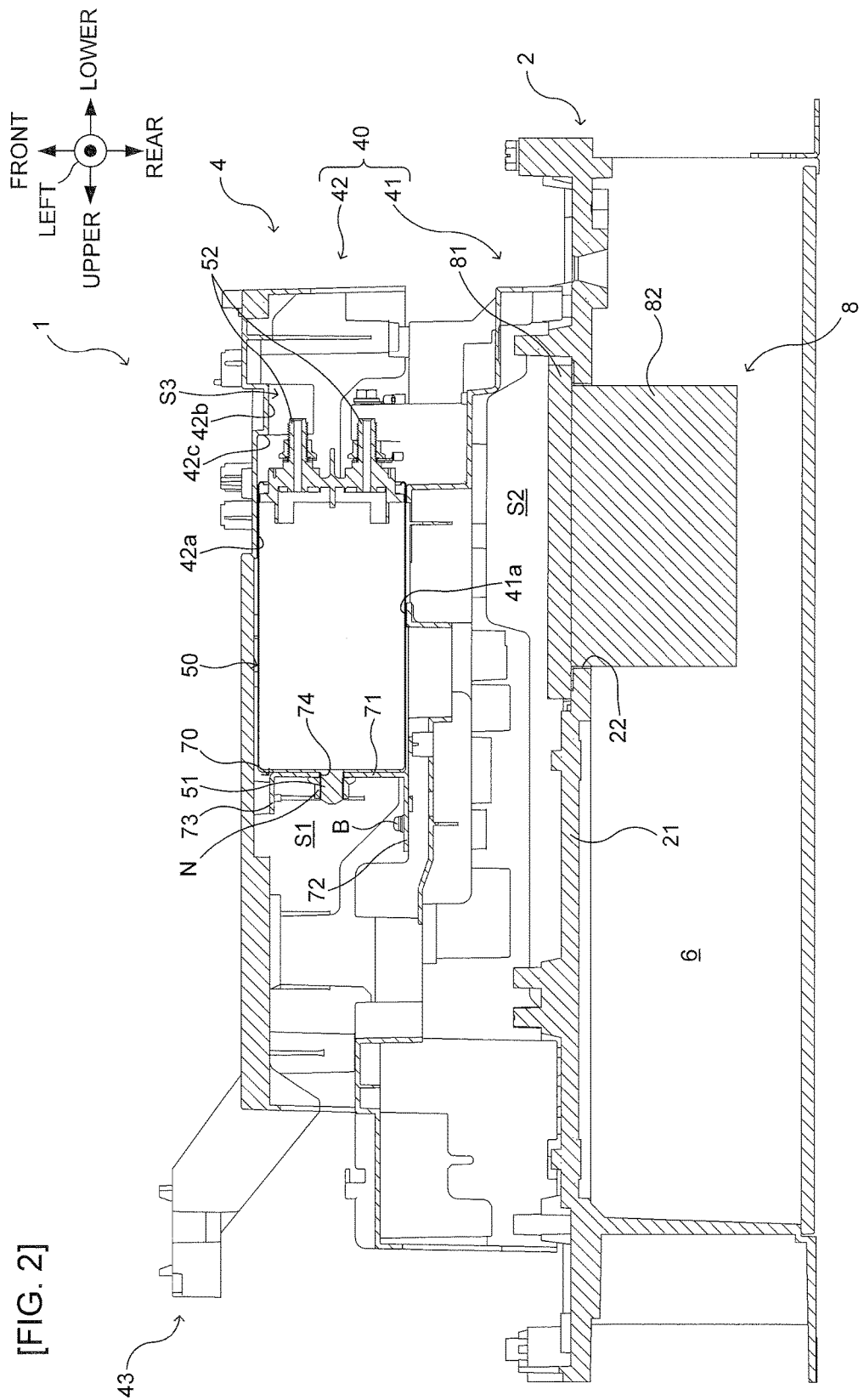
[FIG. 2]

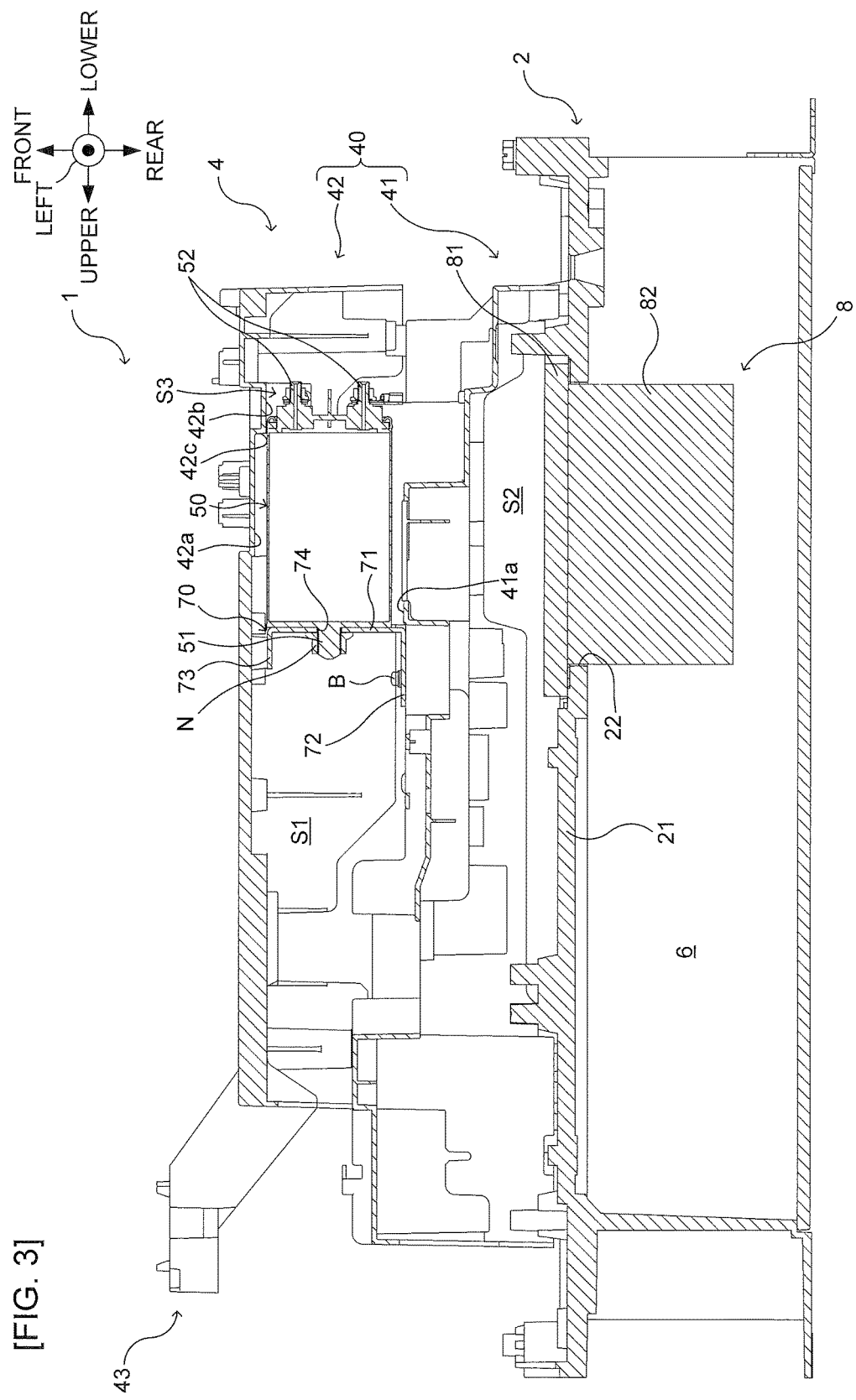
[FIG. 3]

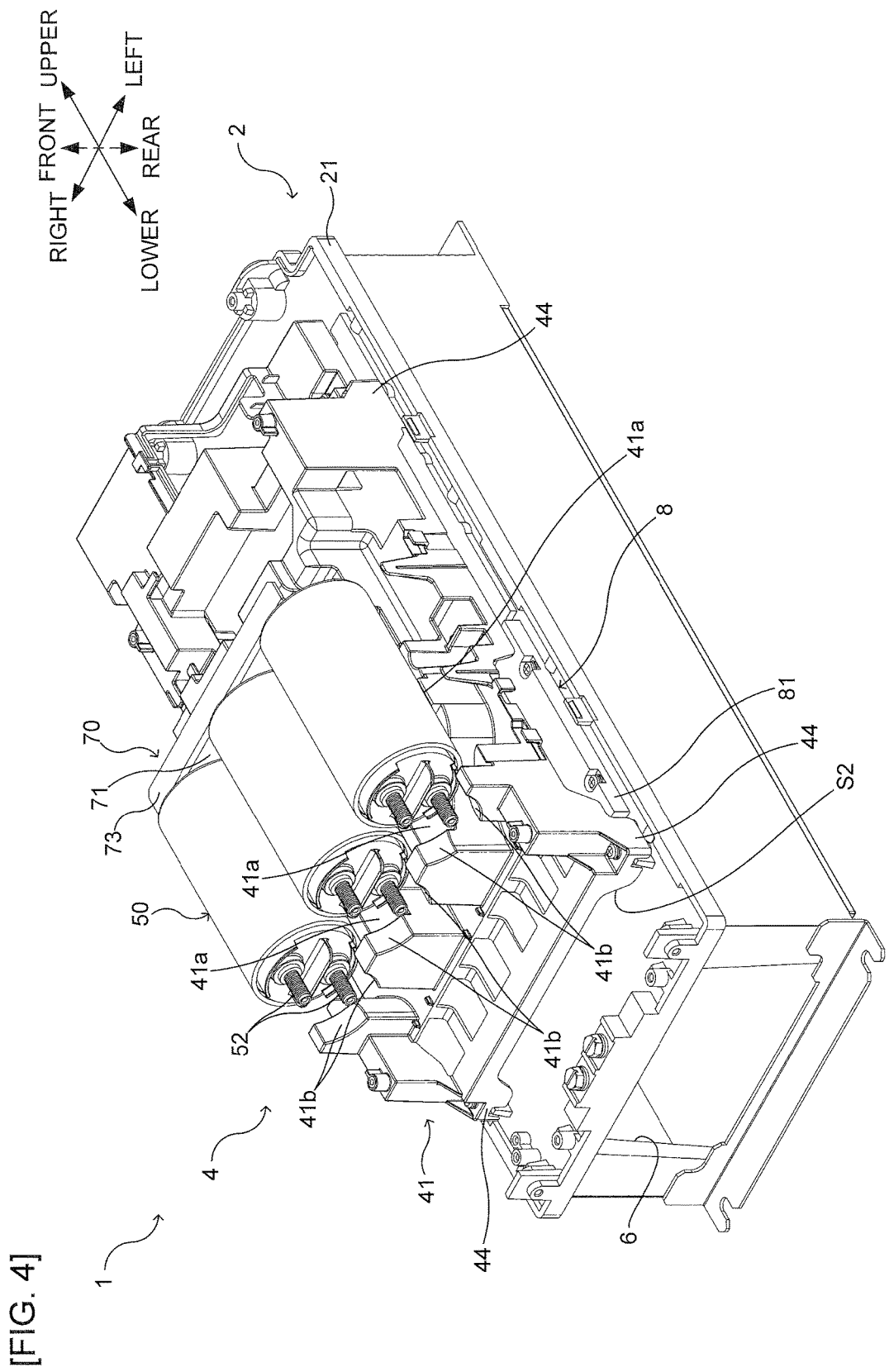
[FIG. 4]

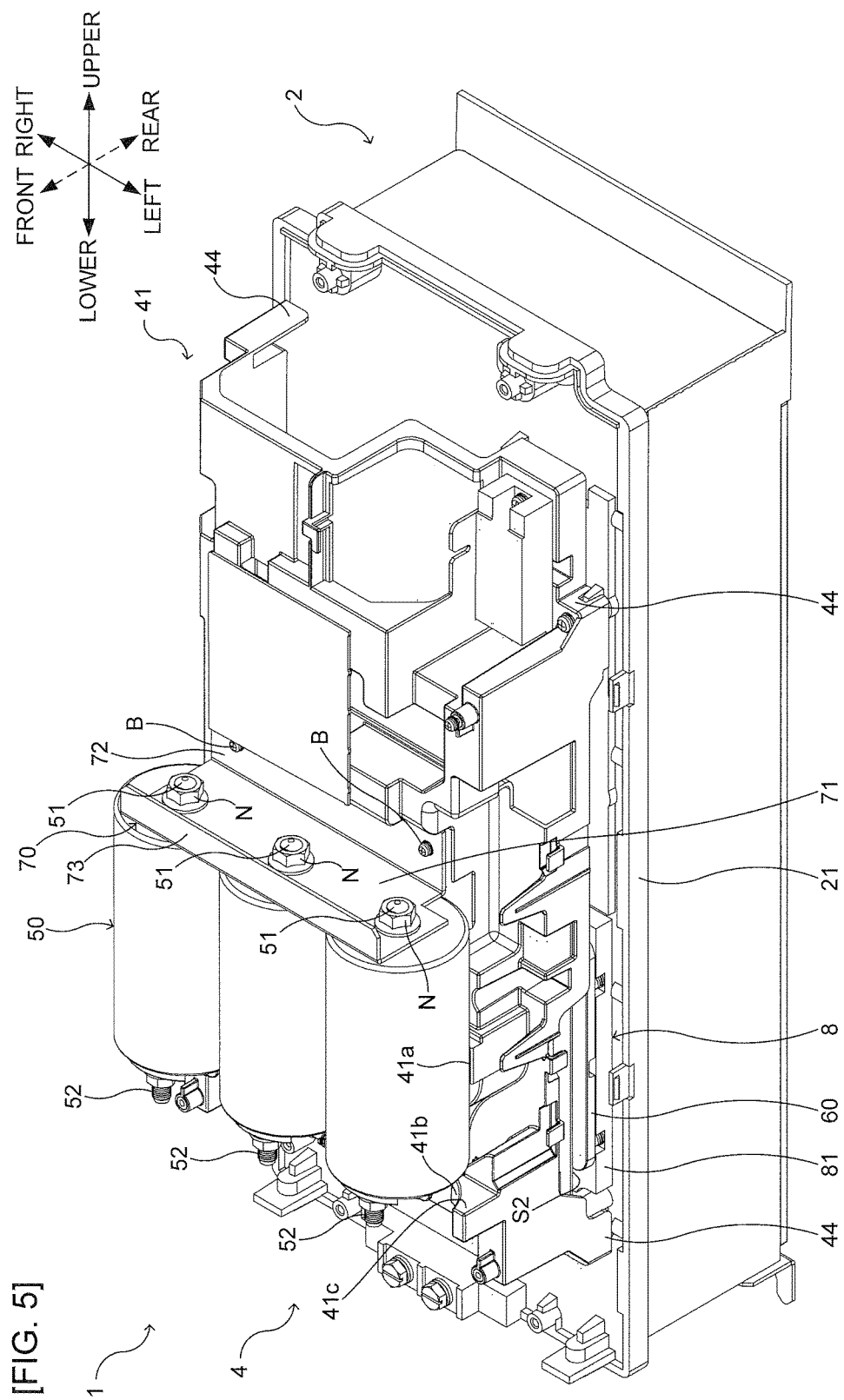
[FIG. 5]

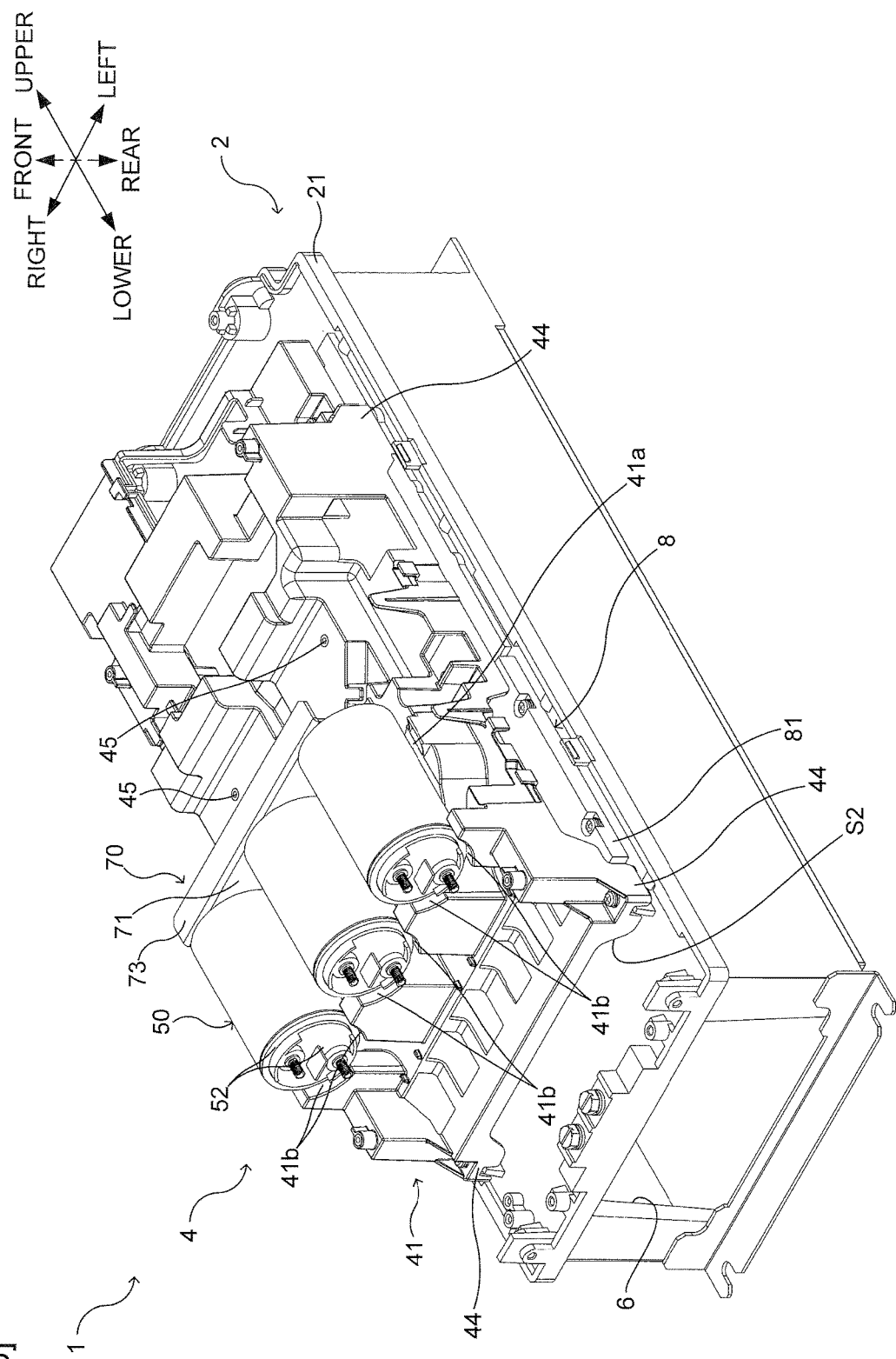
[FIG. 6]

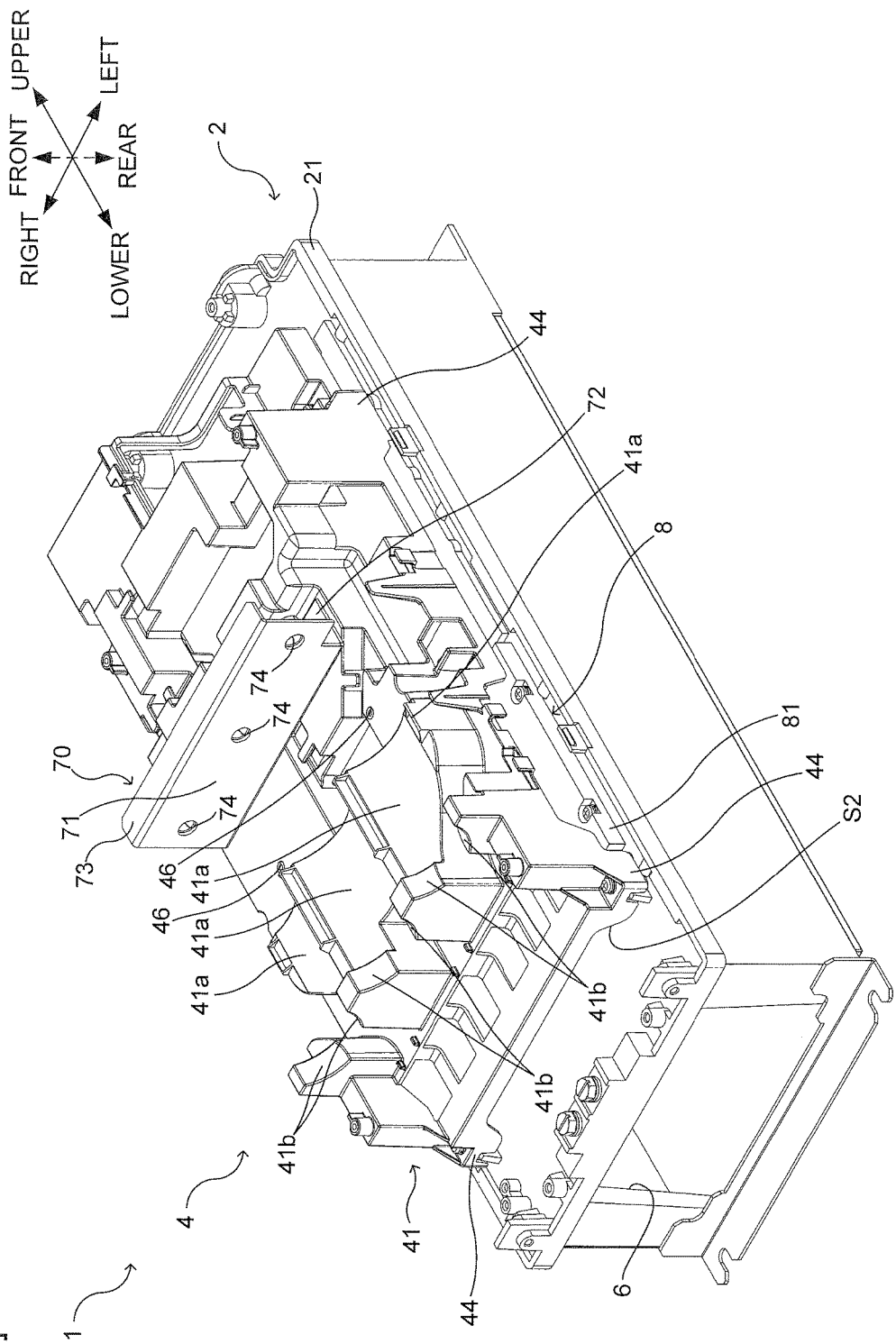

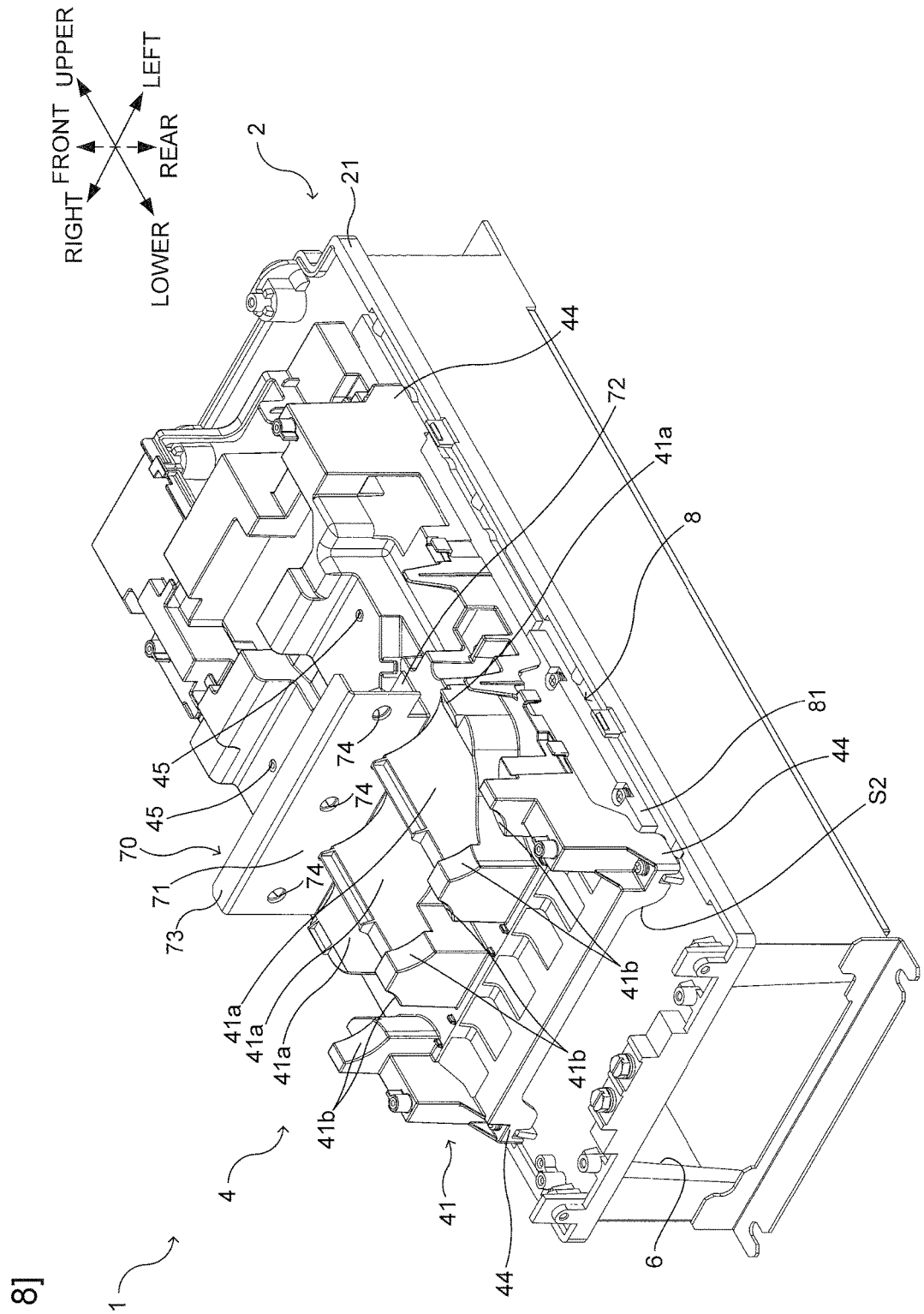

CAPACITOR COVER AND POWER CONVERSION DEVICE

CROSS-REFERENCE TO RELATED APPLICATION

This is a continuation application of PCT/JP2014/059666, filed Apr. 1, 2014, which was published under PCT article 21(2).

TECHNICAL FIELD

The present disclosure relates to a capacitor cover and a power conversion device.

BACKGROUND

An inverter unit in which a capacitor and a control board are integrated by fixing the control board to a capacitor fixing base so as to be embedded in a housing is known.

SUMMARY

According to one aspect of the disclosure, there is provided a capacitor cover configured to store a plurality of capacitors of a power conversion device. The capacitor cover includes a first cover including a plurality of types of first contact surfaces configured to be in contact with one side of each surface of the capacitors of plurality of types with different sizes.

BRIEF DESCRIPTION OF THE DRAWINGS

FIG. 1 is a perspective view of a power conversion device according to an embodiment in a state where a large-size capacitor is stored in the capacitor cover with a body cover omitted.

FIG. 2 is a vertical sectional view of the power conversion device in the state as shown in FIG. 1.

FIG. 3 is a vertical sectional view of the power conversion device in the state where a small-size capacitor is stored in the capacitor cover with the body cover omitted.

FIG. 4 is a perspective view of the power conversion device in the state as shown in FIG. 2 with a second cover omitted.

FIG. 5 is a perspective view of the power conversion device in the state as shown in FIG. 2 with the second cover omitted.

FIG. 6 is a perspective view of the power conversion device in the state as shown in FIG. 3 with the second cover omitted.

FIG. 7 is a perspective view of the power conversion device with the capacitors omitted from the state as shown in FIG. 4.

FIG. 8 is a perspective view of the power conversion device with the capacitors omitted from the state as shown in FIG. 6.

DESCRIPTION OF THE EMBODIMENTS

Hereinafter, an embodiment will be described referring to the drawings. Note that the terms noted in the drawings, that is, "upper", "lower", "left", "right", "front" and "rear" denote the respective directions to be described in the specification. However, it is to be noted that the positional relationships among the respective components of the capacitor cover and the power conversion device will be arbitrarily expressed without being limited to those specified as "upper", "lower", "left", "right", "front" and "rear".

<Schematic Configuration of Power Conversion Device>

First, the power conversion device according to the present embodiment will be described with respect to schematic configuration referring to FIG. 1.

As FIG. 1 shows, a power conversion device 1 is configured to convert the supplied power into another power and output it. Any type of power conversion device may be available as the power conversion device 1, for example, AC-DC converter, DC-AC converter, AC-AC converter (for example, matrix converter), and DC-DC converter so long as such device is capable of performing the power conversion.

The power conversion device 1 includes a housing 2 having a substantially plate-like housing base 21 at the front side and a wind tunnel part 6 formed therein, a main body 4 disposed to the front side of the housing base 21 and a body cover (not shown) for storing the main body 4.

Note that, FIG. 1 and subsequent respective drawings illustrate the power conversion device 1 so that the longitudinal direction of the housing 2, the width direction perpendicular to the longitudinal direction, and the depth direction perpendicular to both the longitudinal and width directions correspond to the upper-lower direction, the left-right direction, and the front-rear direction, respectively. FIG. 1 and subsequent respective drawings appropriately omit the respective components of the power conversion device 1.

A heat sink 8 attached to the housing base 21 includes a substantially plate-like base 81 and a plurality of fins 82 (see FIG. 2 to be described later) disposed to protrude from the surface of the base 81 at the rear side (hereinafter referred to as "rear surface"). The heat sink 8 has the plurality of fins 82 inserted into an opening 22 (see FIG. 2 etc. to be described later) of the housing base 21 from the front side thereof so as to be disposed in the wind tunnel part 6. The base 81 is then fixed to the front surface (hereinafter appropriately referred to as "front surface") of the housing base 21 with screws, for example, so as to be attached to the housing base 21.

The main body 4 includes a plurality of electric components such as capacitors 50 and a switch module 60, and a capacitor cover 40 which is fixed to the front surface of the housing base 21.

The switch module 60 includes switching elements (not shown), and is fixed to the front surface of the base 81 of the heat sink 8 with screws, for example, while being stored in a second storage part S2 to be described later.

The capacitor cover 40 is configured to store a plurality of types of capacitors 50 with different sizes. In the present embodiment, the capacitor cover 40 is configured to store two types of capacitors 50 with different sizes. Note that the capacitor cover 40 may be configured to store three or more types of capacitors 50 with different sizes.

The capacitor cover 40 is configured to store three capacitors 50 each of the same type. Note that it may be configured to store one, two, four or more capacitors 50 of the same type.

Hereinafter, configurations of the capacitor 50 and the capacitor cover 40 will be described referring to FIGS. 1 to 8. Note that, FIGS. 1, 2, 4, 5, and 7 represent the state where each of the capacitors 50 with large size (hereinafter also referred to as "large-size capacitor 50") of two types of capacitors 50 with different sizes is stored in the capacitor cover 40. Meanwhile, FIGS. 3, 6, and 8 represent the state where each of the capacitors 50 with small size (hereinafter referred to as "small-size capacitor 50") of two types of capacitors 50 with different sizes is stored in the capacitor cover 40.

<Capacitor Configuration>

As FIGS. 2 to 6 show, each of the capacitors 50 to be stored in the capacitor cover 40 is a cylindrical film capacitor using the film (for example, plastic film) as the dielectric, and exhibits the property of extending along the cylindrical axis direction (in this example, the upper-lower direction) in the overcurrent state. Note that it is possible to use the cylindrical capacitor as the capacitor 50, which does not exhibit the property of extending along the cylindrical axis direction in the overcurrent state. The capacitor 50 may be arbitrarily shaped such as the coin type and the rectangular type without being limited to the cylindrical type. The capacitor 50 may be arbitrarily formed without being limited to the film capacitor, for example, the ceramic capacitor and the electrolytic capacitor.

A ground terminal 51 is connected to a cylindrical axial end (the upper end in this example) of each of the capacitors 50, and two wiring terminals 52 are connected to the other cylindrical axial end (the lower end in this example). The ground terminal 51 is electrically connected with a securing member 70 to be described later. A cable wiring (not shown) for connection with the power source and any other electric components (reactor, for example) is connected to the wiring terminals 52. In this example, each lower end of the respective capacitors 50 at a side opposite to a side to be secured to the securing member 70 is configured to extend along the cylindrical axis direction. Note that it is possible to employ the cylindrical capacitor as the capacitor 50 having both the ground terminal and the wiring terminal connected to one of the cylindrical axial ends.

Two types of capacitors 50 which may be stored in the capacitor cover 40, that is, the large-size capacitor 50 and the small-size capacitor 50, have mutually different outside dimensions. More specifically, the large-size capacitor 50 and the small-size capacitor 50 have different dimensions both in the cylindrical axis direction and in the radial direction. Note that it is also possible to have the large-size capacitor 50 and the small-size capacitor 50 with different dimensions only in one of the cylindrical axis direction and the radial direction.

<Capacitor Cover Configuration>

As FIGS. 1 to 8 show, the capacitor cover 40 includes a first resin cover 41 with substantially rectangular shape in a planar view, and a second resin cover 42 detachably attached to the first cover 41, which has a substantially rectangular shape in a planar view. Note that each shape of the first cover 41 and the second cover 42 is not limited to the substantially rectangular shape in a planar view, but may be arbitrarily shaped. It is also possible to use any other material for forming the first cover 41 and the second cover 42 without being limited to the resin. The first cover 41 is fixed to the front surface of the housing base 21 while having the second cover 42 attached to the first cover 41 from the front side so that the capacitor cover 40 is fixed to the front surface of the housing base 21.

A first storage part S1 is defined between the first cover 41 and the second cover 42 of the capacitor cover 40 (see FIGS. 2 and 3). The three capacitors 50 are stored in the first storage part S1. More specifically, three capacitors 50 are stored in the first storage part S1 while being arranged along the left-right direction.

(First Cover)

Three pairs of first contact surfaces 41a, 41b as two types are formed on the side of the first cover 41, which faces the second cover 42 (the front side in this example) while being arranged in the left-right direction so as to be brought into contact with each one surface side (the rear side in this example) of the large-size capacitor 50 and the small-size capacitor 50. The first contact surfaces 41a, 41b have concave shapes with different inside dimensions. More specifically, the first contact surfaces 41a, 41b have cylindrical shapes each with different curvature radius.

The first contact surface 41a is brought into contact with the rear side surface of the cylindrical large-size capacitor 50, which is formed into the cylindrical shape with the curvature radius (relatively large) adapted to the external shape of the corresponding large-size capacitor 50. Meanwhile, the first contact surface 41b is brought into contact with the rear side surface of the cylindrical small-size capacitor 50, which is formed into the cylindrical shape with the curvature radius (relatively small) adapted to the external shape of the corresponding small-size capacitor 50. In this state, the first contact surface 41b is disposed on the side lower than the first contact surface 41a. Note that it is possible to dispose the first contact surface 41b on the side upper than the first contact surface 41a. A stepped surface 41c is formed on the boundary between the first contact surfaces 41a, 41b resulting from the difference in height between those surfaces (see FIG. 5).

Note that shapes of the first contact surfaces 41a, 41b are not limited to be cylindrical shape, but may be arbitrarily shaped so long as they are adapted to the external shape of the corresponding capacitor 50. For example, each of the first contact surfaces 41a, 41b has a substantially concave rectangular cross section, substantially concave trapezoidal cross section, and a substantially concave V-like cross section. Alternatively, the first contact surfaces 41a, 41b do not necessarily have to be concave shaped, but may be convex or planar shaped.

Legs 44 which can be fixed to the front surface of the housing base 21 are disposed on a plurality of points (for example, four corners) of the peripheral edge of the first cover 41. Specifically, the legs 44 are fixed to the front surface of the housing base 21 with screws, for example so that the first cover 41 is secured to the front surface while being supported with the plurality of legs 44. The first cover 41 and the legs 44 which support the first cover 41 form the second storage part S2 having a plurality of open peripheral parts at the side facing the first storage part S1 of the first cover 41, in other words, between the first cover 41 and the housing base 21. The switch module 60 is stored in the second storage part S2 (see FIGS. 1 and 5). The capacitor 50 and the switch module 60 are arranged while being stacked in the direction perpendicular to the planar direction of the housing base 21 (front-rear direction in this example).

(Second Cover)

Three pairs of two types of second contact surfaces 42a, 42b are formed at the positions corresponding to the first contact surfaces 41a, 41b of the first cover 41, respectively, on the side of the second cover 42, facing the first cover 41 (the rear side in this example) while being arranged along the left-right direction so as to be brought into contact with each of the other surface sides (the front side in this example) of the large-size capacitor 50 and the small-size capacitor 50. The second contact surfaces 42, 42b have concave shapes with different inside dimensions. More specifically, the second contact surfaces 42a, 42b have cylindrical shapes each with different curvature radius.

The second contact surface 42a is brought into contact with the front side surface of the cylindrical large-size capacitor 50, which is formed into the cylindrical shape with the curvature radius (relatively large) adapted to the external shape of the corresponding large-size capacitor 50. Meanwhile, the second contact surface 42b is brought into contact with the front side surface of the cylindrical small-size capacitor 50, which is formed into the cylindrical shape with the curvature radius (relatively small) adapted to the external shape of the corresponding small-size capacitor 50. A stepped surface 42c is formed on the boundary between the second contact surfaces 42a, 42b resulting from the difference in height between those surfaces (see FIGS. 2 and 3).

Note that shapes of the second contact surfaces 42a, 42b are not limited to be cylindrical shape, but may be arbitrarily shaped so long as they are adapted to the external shape of the corresponding capacitor 50. For example, each of the second contact surfaces 42a, 42b has a substantially concave rectangular cross section, a substantially concave trapezoidal cross section, and a substantially concave V-like cross section. Alternatively, the second contact surfaces 42a, 42b do not necessarily have to be concave shaped, but may be convex or planar shaped.

In the case of storage of the large-size capacitor 50 in the capacitor cover 40, the first contact surface 41a of the first cover 41 and the second contact surface 42a of the second cover 42 serve to hold the rear and front side surfaces of the subject large-size capacitor 50. Meanwhile, in the case of storage of the small-size capacitor 50 in the capacitor cover 40, the first contact surface 41b of the first cover 41 and the second contact surface 42b of the second cover 42 serve to hold the rear and front side surfaces of the subject small-size capacitor 50. That is, one type of the capacitor cover 40 (first cover 41 and second cover 42) allows the contact surfaces to hold the rear and front side surfaces of two types of the cylindrical capacitors 50 with different radial dimensions (large-size capacitor 50 and small-size capacitor 50). As a result, one type of the capacitor cover 40 is able to store two types of cylindrical capacitors 50 with different radial dimensions (large-size capacitor 50 and small-size capacitor 50). In other words, the first contact surfaces 41a, 41b of the first cover 41 and the second contact surfaces 42a, 42b of the second cover 42 correspond to an example of means for storing a plurality of types of the capacitors with different sizes by one type of the capacitor cover.

A hook 43 is attached to the upper end of the second cover 42 for hooking the wiring (not shown) of the power conversion device 1. Note that the number of the hooks 43 and the location at which they are disposed on the second cover 42 are not specifically limited. It is possible to attach the hook to the first cover 41 in place of or in addition to the second cover 42. Alternatively, the hook does not have to be attached to any of the first cover 41 and the second cover 42. The hook 43 is capable of accommodating the high frequency noise absorbing filter (not shown) such as the ferrite core, which is disposed for the wiring to be hooked by the hook 43. Note that the hook 43 may be configured only to hook the wiring without allowing accommodation of the absorbing filter to be disposed for the wiring.

(Fixing Member)

The securing member 70 is secured onto the front surface of the first cover 41 so as to be positionally changed within the first storage part S1. Note that it is also possible to secure the securing member 70 to the rear surface of the second cover 42 in place of or in addition to the front surface of the first cover 41 so as to be positionally changed within the first storage part S1. Each upper end of the three capacitors 50 is secured to the securing member 70. Specifically, the securing member 70 is secured to the front surface of the first cover 41 between each lower end of the three capacitors 50 having fixed upper end, and the stepped surface 41c of the first cover 41 at the position at which a gap S3 with predetermined dimension is formed (see FIGS. 2 and 3). The dimension of the gap S3 is determined so as to allow extensions of those three capacitors 50 each having the upper end secured to the securing member 70 along the cylindrical axis direction.

The securing member 70 includes a flat plate 71, and two extension parts 72, 73 which extend from the respective ends of the flat plate 71 in a direction perpendicular to the flat plate 71. A through hole (not shown) through which a screw B to be described later may be inserted is formed in the extension part 72 at one end side (rear end side in this example). Two insertion holes 45 through which the screws B to be described later may be inserted are formed around the position corresponding to the upper end of the large-size capacitor 50 on the front surface of the first cover 41. Two insertion holes 46 through which the screws B to be described later may be inserted are formed around the position corresponding to the upper end of the small-size capacitor 50 (see FIGS. 6 to 8).

In the case of storage of the large-size capacitor 50 in the capacitor cover 40, the securing member 70 is disposed on the front surface of the first cover 41 so that the through holes of the extension part 72 are overlapped with the insertion holes 45, and then the screws B are inserted into the through holes and the insertion holes 45 for fastening (the insertion hole 45 or nut). As a result, the securing member 70 is secured onto the front surface of the first cover 41 between the lower end of the large-size capacitor 50 with the fixed upper end and the stepped surface 41c at the position where the gap S3 is formed to have the dimension which allows extension of the large-size capacitor 50. In case of abnormality such as overcurrent state, the lower end of the large-size capacitor 50 extends along the cylindrical axis direction in the gap S3 so as to exhibit the protective function.

Meanwhile, in the case of storage of the small-size capacitor 50 in the capacitor cover 40, the securing member 70 is disposed on the front surface of the first cover 41 so that the through holes of the extension part 72 are overlapped with the insertion holes 46, and then the screws B are inserted into the through holes and the insertion holes 46 for fastening (the insertion hole 46 or nut). As a result, the securing member 70 is secured to the front surface of the first cover 41 between the lower end of the small-size capacitor 50 with the fixed upper end and the stepped surface 41c at the position where the gap S3 is formed to have the dimension which allows extension of the small-size capacitor 50. In case of abnormality such as overcurrent state, the lower end of the small-size capacitor 50 extends in the gap S3 along the cylindrical axis direction so as to exhibit the protective function.

Note that, in place of the insertion holes 45, 46, it is possible to form a long hole in the front surface of the first cover 41 to have the length extending from the area around the position corresponding to the upper end of the large-size capacitor 50 to the area around the position corresponding to the upper end of the small-size capacitor 50.

In the case that the capacitor 50 having the upper end secured to the securing member 70 does not have the property of extension along the cylindrical axis direction in the overcurrent state, the securing member 70 may be secured to the front surface of the first cover 41 at the position where the gap S3 is not formed between the lower end of the subject capacitor 50 and the stepped surface 41c.

In this embodiment, the securing member 70 is made of appropriate conductive material (for example, iron) having conductive property. The flat plate 71 of the securing member 70 has three through holes 74 (corresponding to a terminal connection part) which can be electrically connected through insertion of the ground terminal 51 of the capacitor 50. Therefore, the ground terminal 51 of each of the capacitors 50 to be stored in the capacitor cover 40 is inserted into the corresponding through hole 74, and secured to the flat plate 71 through fastening with the nut N in the electrically connected state. As a result, the ground terminal 51 of each of the capacitors 50 is grounded to the housing 2 via the securing member 70.

Note that the terminal connection part is not limited to the through hole 74, but may be arbitrarily configured so long as the ground terminal 51 may be electrically connected. In the case that the ground terminal 51 does not have to be electrically connected with the securing member 70, the terminal connection part does not have to be provided for the securing member 70. The securing member 70 may have the non-conductive property. Furthermore, it is possible to fix the capacitor 50 to be stored in the capacitor cover 40 to the front surface of the first cover 41 so as to be positionally changeable by using the securing member with the other structure such as the capacitor band in place of the securing member 70 with the flat plate 71 and the extension parts 72, 73.

Advantageous Effects of Present Embodiment

As described above, the capacitor cover 40 of the power conversion device 1 according to the present embodiment includes the first cover 41. The first cover 41 includes two types of first contact surfaces 41a, 41b which are brought into contact with each of the rear side surfaces of two types of capacitors 50 with different sizes. Especially, in the present embodiment, the capacitor cover 40 includes the second cover 42 which is detachably attached to the first cover 41. The second cover 42 includes two types of second contact surfaces 42a, 42b which are brought into contact with the front side surfaces of two types of capacitors 50 with different sizes at the positions corresponding to the first contact surfaces 41a, 41b of the first cover 41, respectively. The first storage part S1 for storing the capacitor 50 is formed between the first cover 41 and the second cover 42 to be attached to the first cover 41.

As a result, the use of one type of the first cover 41 and the second cover 42 allows the rear and front side surfaces of two types of capacitors 50 with different sizes (capacities) to be held by the contact surfaces. In other words, the use of one type of the capacitor cover 40 allows storage of two types of capacitors 50 with different sizes. As a result, the capacitor covers 40 adapted to the respective sizes of the capacitors 50 to be stored are no longer required, thus reducing the number of components and the cost.

Especially, in the present embodiment, the capacitor cover 40 has the securing member 70 fixed to the first cover 41 in the first storage part S1 so as to be positionally changeable for fixing the upper end of the capacitor 50. As a result, the use of one type of the securing member 70 allows two types of capacitors 50 with different sizes to have each upper end fixed by changing the position of the securing member 70. The upper end of the capacitor 50 may be fixed by the securing member 70 in addition to holding of the surface of the capacitor 50 with contact surfaces of the first cover 41 and the second cover 42, thus rigidly fixing the capacitor 50. The use of one type of the securing member 70 allows fixation of two types of capacitors 50 with different sizes. As a result, the securing members 70 adapted to the respective sizes of the capacitors 50 to be stored are no longer required, thus reducing the number of components and the cost.

Especially, in the present embodiment, the first contact surfaces 41a, 41b of the first cover 41 have concave shapes with different inside dimensions, and the second contact surfaces 42a, 42b of the second cover have concave shapes with different inside dimensions. As a result, the use of one type of the first cover 41 and the second cover 42 allows the rear and front side surfaces of two types of capacitors 50 with different outside dimensions to be held by the contact surfaces. As a result, the two types of capacitors 50 with different outside dimensions may be stored in one type of the capacitor cover 40.

Especially, in the present embodiment, the first contact surfaces 41a, 41b of the first cover 41 have cylindrical shapes each with different curvature radius, and the second contact surfaces 42a, 42b of the second cover have cylindrical shapes each with different curvature radius. As a result, the use of one type of the first cover 41 and the second cover 42 allows the rear and front side surfaces of two types of cylindrical capacitors 50 with different diameters to be held by the contact surfaces. As a result, the two types of cylindrical capacitors 50 with different diameters may be stored in one type of the capacitor cover 40.

Especially, the present embodiment provides the following advantageous effect. The capacitor 50 employed for the power conversion device 1 may be of cylindrical type which is configured to extend along the cylindrical axis direction in case of abnormality such as overcurrent state so as to exhibit the protective function. Upon storage of the above-structured capacitor 50 in the capacitor cover 40, fixation of both ends of the capacitor 50 may interfere with the protective function. Therefore, at least one end of the capacitor 50 has to be kept free without fixation. In the present embodiment, the securing member 70 is secured at the position at which the gap S3 is formed to have the predetermined dimension between the lower end of the capacitor 50 with the upper end secured to the securing member 70 and the stepped surface 41c of the first cover 41. As a result, the gap S3 is formed to have the dimension which allows extension of the capacitor 50, which ensures to store the capacitor 50 while being fixed to exhibit the protective function.

Especially, the present embodiment further provides the following advantageous effect. The capacitor 50 employed for the power conversion device 1 is configured to have the ground terminal 51 at one end in the cylindrical axis direction. Upon storage of the capacitor 50 in the capacitor cover 40, the ground terminal 51 has to be grounded to the housing 2. In the present embodiment, the securing member 70 has conductivity, and through holes 74 which allow the ground terminal 51 of the capacitor 50 to be electrically connected. As a result, the ground terminal 51 of the capacitor 50 may be grounded to the housing 2 via the securing member 70. It is possible to use the securing member as the ground member, thus reducing the number of components and the cost.

Especially, in the present embodiment, the second cover 42 includes the hook 43 for hooking the wiring of the power conversion device 1, which ensures to fix or regulate the wiring of the power conversion device 1. It is also possible to attach the absorption filter to the hook 43 for reducing high-frequency noise.

Especially, in the present embodiment, the legs 44 are formed at a plurality of positions on the peripheral edge of the first cover 41, respectively, and form the second storage part S2 for storing the switch module 60 at the side opposite to the first storage part S1 of the first cover 41. As a result, in fixation of the capacitor cover 40 to the housing base 21, the capacitor 50 and the switch module 60 may be disposed while being stacked in the direction perpendicular to the planar direction of the housing base 21. With the arrangement, compared with the case that the capacitors 50 and the switch module 60 are arranged along the planar direction (upper-lower direction, or left-right direction) of the housing base 21, the dimension of the power conversion device 1 in the planar direction (upper-lower direction, and left-right direction) may be reduced. Accordingly, the power conversion device 1 may be made compact. The second storage part S2 for storing the switch module 60 is formed by the first cover 41 and the plurality of legs 44 so that the storage space includes a plurality of open peripheral parts. It is therefore possible to cool the switch module 60 having the switching element with relatively high heat value while being stored in the second storage part S2 by means of forced convection or natural convection.

Modified Example

Note that the disclosed embodiment is not limited to the one as described above, but may be variously modified so long as it does not deviate from the concept and scope of the disclosure.

In the embodiment, the capacitor cover 40 includes the two covers, that is, the first cover 41 and the second cover 42. However, the number of the covers that form the capacitor cover 40 is not limited to two. For example, the capacitor cover 40 may be formed only by the single cover (corresponding to the first cover) having a plurality of types of contact surfaces (corresponding to the first contact surface), which are brought into contact with each one surface side of the plurality of types of the capacitors 50 with different sizes. Alternatively, the capacitor cover 40 is allowed to include three or more covers.

It is noted that the term "vertical," used in the above description is not used in the exact meanings thereof. Specifically, this term "vertical," allow tolerances and errors in design and manufacturing and have meanings of "approximately vertical,"

In addition, techniques by the embodiment and each modified example may be appropriately combined and utilized in addition to the examples having already described above.

In addition to that, although exemplification is not performed one by one, the embodiment and each modified example are carried out by various changes being applied thereto without departing from the technical idea of the present disclosure.

What is claimed is:

1. A power conversion device comprising:
 a capacitor cover configured to store a plurality of capacitors, comprising:
 a first cover comprising a plurality of types of first contact surfaces configured to be in contact with a portion of each surface of the capacitors of plurality of types with different sizes;
 a second cover configured to be detachably attached to the first cover, the second cover comprising a plurality of types of second contact surfaces configured to be in contact with another portion of the each surface of the capacitors of plurality of types with different sizes at positions corresponding to the first contact surfaces, the second cover being configured to define a first storage part for storing at least one of the plurality of capacitors between the first cover and the second cover when the second cover is attached to the first cover; and
 a securing plate secured to at least one of the first cover and the second cover in the first storage part so as to be positionally changed, the securing plate configured to be secured to one end of the at least one of the plurality of capacitors.

2. The power conversion device according to claim 1, wherein the first cover comprises the plurality of types with a different inside dimension of the first contact surfaces each having a concave shape, and
 wherein the second cover comprises the plurality of types with a different inside dimension of the second contact surfaces each having a concave shape.

3. The power conversion device according to claim 2, wherein the first cover comprises the plurality of types with a different curvature radius of the first contact surfaces each having a concave shape, and
 wherein the second cover comprises the plurality of types with a different curvature radius of the second contact surfaces each having a concave shape.

4. The power conversion device according to claim 3, wherein the first cover comprises a first stepped surface on a boundary between the two first contact surfaces each having the different curvature radius,
 wherein the second cover comprises a second stepped surface on a boundary between the two second contact surfaces each having the different curvature radius, and
 wherein the securing plate is secured at a position of the at least one of the first cover and the second cover such that a gap with a predetermined dimension is formed between another end of the at least one of the plurality of capacitors secured to the securing plate and at least one of the first stepped surface and the second stepped surface.

5. The power conversion device according to claim 4, wherein the securing plate comprises a terminal connection part having conductivity and configured so as to be electrically connected with a ground terminal disposed on the one end of the at least one of the plurality of capacitors.

6. The power conversion device according to claim 5, wherein at least one of the first cover and the second cover comprises a hook part configured to hook a wiring of the power conversion device.

7. The power conversion device according to claim 6, wherein the capacitor cover comprises a plurality of leg parts disposed on a plurality of positions on a peripheral edge of one cover of the first cover and the second cover, the plurality of leg parts defining a second storage part for storing a switching element of the power conversion device at a side opposite to the first storage part of the one cover.

8. The power conversion device according to claim 1, further comprising:
 a housing to which the capacitor cover is secured; and
 the plurality of capacitors stored in the capacitor cover.

9. The power conversion device according to claim 8, wherein the at least one of the plurality of capacitors is a cylindrical type capacitor configured to extend along a cylindrical axis direction in an overcurrent state, and the at least one of the plurality of capacitors comprises a ground terminal which is electrically connected with a securing plate of the capacitor cover at the one end, and comprises a wiring terminal to which a cable wiring is connected at another end.

10. A capacitor cover configured to store a plurality of capacitors of a power conversion device, comprising:
   a first cover comprising a plurality of types of first contact surfaces configured to be in contact with a portion of each surface of the capacitors of plurality of types with different sizes;
   a second cover configured to be detachably attached to the first cover, the second cover comprising a plurality of types of second contact surfaces configured to be in contact with another portion of the each surface of the capacitors of plurality of types with different sizes at positions corresponding to the first contact surfaces, the second cover being configured to define a first storage part for storing at least one of the plurality of capacitors between the first cover and the second cover when the second cover is attached to the first cover; and
   a securing plate secured to at least one of the first cover and the second cover in the first storage part so as to be positionally changed, the securing plate configured to be secured to one end of the at least one of the plurality of capacitors.

* * * * *